Sept. 19, 1961 A. KAISER ET AL 3,001,091
CURRENT PULSE GENERATOR
Filed March 12, 1958

INVENTORS
ARTHUR KAISER
CARL TISHLER
BY Isidore Match
ATTORNEY

United States Patent Office 3,001,091

Patented Sept. 19, 1961

3,001,091

CURRENT PULSE GENERATOR

Arthur Kaiser, Trumbull, and Carl Tishler, Bridgeport, Conn., assignors to Sperry Rand Corporation, New York, N.Y., a corporation of Delaware Filed Mar. 12, 1958, Ser. No. 721,005
5 Claims. (Cl. 307—88.5)

This invention relates to current pulse generators and more particularly to a transistor current pulse generator capable of producing relatively high current pulses having a flat pedestal, short rise and decay times, and small storage periods.

In many situations it is necessary to provide circuits for driving a low impedance load with a high current pulse, such circuits being required to switch a given value of current through a low impedance at a given speed and duty cycle. For example, a circuit for driving an inhibit plane of a coincident current ferrite core memory may be required to switch several hundred milliamperes through a load consisting of a small resistance in series with a relatively large inductance.

Heretofore, to provide such a circuit where the active network elements are transistors has required a large number of such transistors in a circuit, generally in parallel arrangement, each of the transistors drawing large quiescent currents. Also, these circuits have not been indepedent of transistor parameter variations.

Accordingly, it is the primary object of this invention to provide a transistor circuit capable of producing relatively high amplitude current pulses which have desirable characteristics, such as fast rise and fall times, relatively flat pedestals, and negligible storage effects.

It is a further object to provide a transistor circuit as in the preceding object wherein there is a negligible current drain from power supplies during quiescent periods and which is substantially independent of transistor parameters.

Generally speaking, in accordance with the invention, there is provided a circuit comprising at least one transistor amplifier wherein there may be driven a current pulse having a chosen amplitude, duty cycle, pulse repetition frequency, and rise and decay times through an inductive load having a predetermined value of inductance. There is included in series with the inductive load, a parallel combination of a resistance and a capacitance, the value of the capacitance being so chosen as to provide a critically damped condition. The transistor utilized in this circuit preferably has a power dissipation rating which is substantially equal to the transit time dissipation plus the dissipation across the transistor when it is conducting at saturation. The voltage rating of the employed transistor is preferably equal to the product of the current through the load and the sum of the series resistances in the output.

For a better understanding of the invention, together with other and further objects thereof, reference is had to the following description taken together with the accompanying drawings and its scope will be pointed out in the appended claims.

Figure 1:
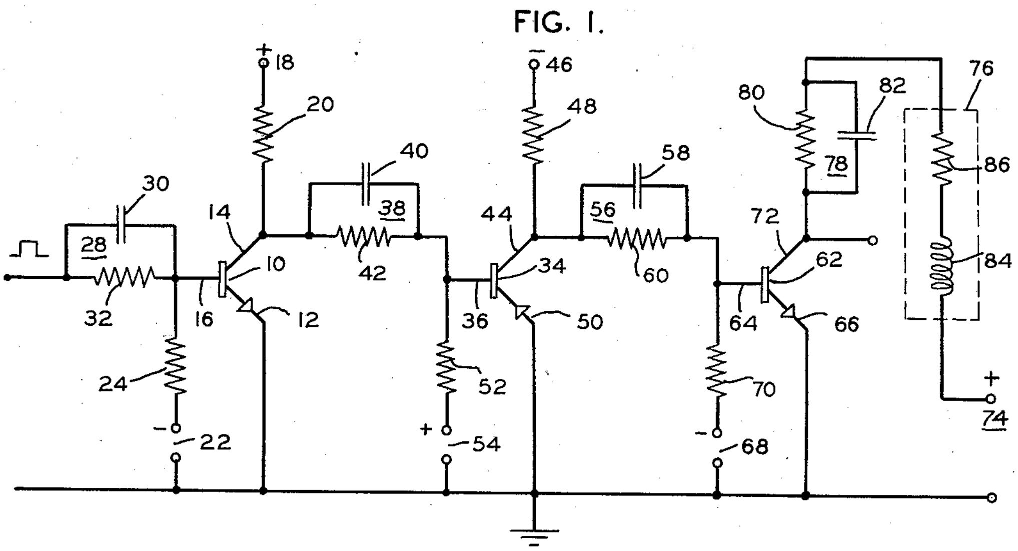
Figure 2:
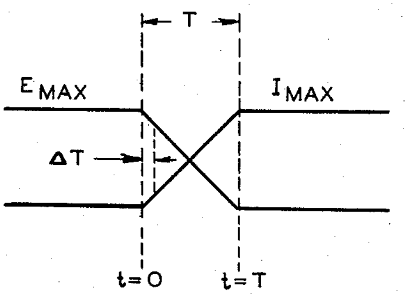
Figure 3:
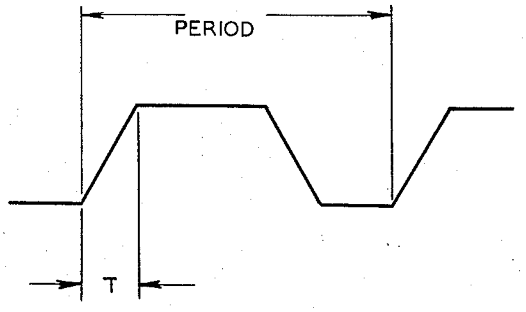
Figure 4:
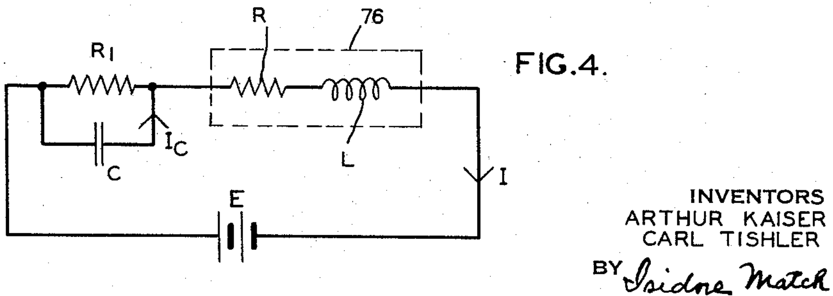

In the drawings, FIG. 1 is a schematic depiction of an embodiment of the invention which employs a cascaded arrangement of three transistors;

FIGS. 2 and 3 are diagrams conveniently utilized in explaining the operation of the circuit of FIG. 1; and FIG. 4 is a theoretical equivalent circuit of the output stage of the circuit in FIG. 1.

Referring now to FIG. 1, there is shown an NPN transistor 10 having an emitter 12, a collector 14, and a base 16. Transistor 10 is connected in the common emitter configuration, positive potential being applied to collector 14 from a potential source 18 through a resistance 20. Base 16 is returned to a source of negative potential 22 through a resistance 24. In series with base 16 is a parallel combination 28 comprising a capacitance 30 and a resistance 32. In the quiescent state with chosen biasing voltages from sources 18 and 22, transistor 10 is maintained at cutoff and upon the application of a positive pulse of a proper value to base 16, transistor 10, is driven into conduction at saturation. The values of resistance 32 and capacitance 30 are so chosen that they convert the input pulse to one having a relatively steep exponential decay, the lowest amplitude of such decay still exceeding the amount required to cause transistor 10 to conduct at saturation. The negative potential applied to base 16 from source 22 is provided to aid in maintaining transistor 10 at cutoff during quiescent periods, and also to minimize the effect of any D.C. restoration effects due to the action of capacitance 30. It is to be noted that with the application to base 16 of a positive pulse whose leading edge greatly exceeds in amplitude the amount required to drive transistor 10 into conduction at saturation, advantageously sharp and short rise times are obtained in the output thereof. Also, the steep exponential decay caused by the action of parallel combination 28 serves to eliminate most of the deleterious effects due to the phenomenon of charge storage delay.

The output from collector 14, which is a pulse with a relatively flat pedestal, is applied to the base 36 of a PNP transistor 34 through a parallel combination 38 of a capacitance 40 and a resistance 42, the values of the components of parallel combination 38 being chosen to cause the same effect as that of parallel combination 28, i.e., the conversion of the flat negative output pulse from collector 14 to a pulse having a relative steep exponential decay. The collector 44 of transistor 34 has negative biasing potential from source 46 applied thereto through a resistance 48, its emitter 50 is connected to a reference potential source, i.e., ground in the present illustration, and base 36 has positive potential from a source 54 applied thereto through a resistance 52. Positive potential source 54 has the same purpose as negative potential source 22 in connection with base 16 of transistor 10, i.e., the assisting in maintaining transistor 34 at cutoff during quiescent states, and also to minimize D.C. restoration effects caused by the action of capacitance 40. Similar to the input pulse to base 16 of transistor 10, the amplitude of the input pulse to base 36 of transistor 34 is chosen to have value much greater than that required to drive transistor 34 into saturation from cutoff to insure short rise times of the output pulse from collector 44. The values of the components of parallel combination 38 are also chosen such that its peaking effect does not cause the input to base 36 to drop below the value necessary to maintain transistor 34 at conduction at saturation. It is seen that the series cascading arrangement of NPN transistor 10 and PNP transistor 34 serves advantageously in that during quiescent periods, both transistors are non-conductive, thereby resulting in a negligible power drain and both transistors are rendered simultaneously conductive with the application of a positive input pulse to the circuit.

The positive output pulse from collector 44 is applied through a parallel combination 56 comprising a capacitance 58 and a resistance 60 to the base 64 of an NPN transistor 62. The emitter 66 of transistor 62 is in the grounded configuration and base 64 is returned to a source of negative potential 68 through a resistance 70. Positive biasing voltage is applied to the collector 72 of transistor 62 from potential source 74 through the load 76 and a parallel combination 78 of a resistance 80 and a capacitance 82. As with parallel combinations 28 and 38, parallel combination 56 serves to peak the positive rectangular output pulse from collector 44 to one having a relatively steep exponential decay, such peaking similarly also not decreasing the amplitude of the input to base 64 to a point where transistor 62 does not conduct at saturation. The negative potential applied to base 64 similar to the potentials applied to the respective bases of the preceding transistors in the circuit is provided to assist in maintaining transistor 62 at cutoff during its quiescent state and to substantially eliminate any D.C. restoration effects caused by the operation of capacitance 58. Transistor 62 is of the NPN type, so that the three transistors in the circuit can simultaneously be substantially at cutoff during the quiescent periods in the circuit and are simultaneously rendered conductive at saturation with the application of a current pulse of suitable amplitude to the input thereto.

As shown in FIG. 1, the load depicted is an inductance 84 in series with a resistance 86. Such depiction is utilized to conveniently illustrate an inductive load with its resistance component.

Considering the operation of the circuit, it is seen that the application of a rectangular positive pulse through parallel combination 28 results in a peaked pulse being applied to base 16. The output at collector 14 is a negative pulse having a relatively flat pedestal, since during the entire period of application of the pulse to base 16, transistor 10 as conducted at saturation. The negative output from collector 14 peaked by parallel combination 38, and applied to base 36, drives transistor 34 into saturation conduction throughout the duration of the pulse. The flat positive output pulse from collector 44 is similarly peaked by the parallel combination 56, and transistor 62 conducts at saturation during the time of the application of the pulse thereto so that the current pulse driven through load 76 is a rectangular current pulse with a flat pedestal and having an amplitude determined by the voltage source 74, load 76, resistance 80 and the saturation resistance of transistor 62. This output current pulse is also one having relatively short rise and decay times due to the fact that the input pulse to each transistor has a leading edge greatly in excess of the amount required to drive the respective transistor into saturation and the width of this output pulse substantially corresponds to the width of the input pulse to the circuit due to the virtual elimination of charge storage effects by the use of the peaking circuits. The base biasing voltages are chosen to be large enough to overcome the voltages which develop across capacitances 30, 40, 58 respectively due to D.C. restoration affects at high pulse repetition rates. Resistances 24, 52 and 70 are signal isolation resistors which are chosen to be large enough not to draw appreciable signal currents from the base circuits but small enough to establish proper D.C. base biased currents. Resistance 80 and capacitance 82 provide a compensating circuit which minimizes the inductance effects of load and the basis of selection of proper values therefor will be further developed hereinbelow.

Typical circuit values for the circuit of FIG. 1 are as follows: capacitance 30, 0.002 microfarad, resistance 32, 470 ohms, potential source 22, minus 2 volts, potential source 18, 10 volts, resistance 20, 150 ohms, capacitance 40, 0.03 microfarad, resistance 42, 33 ohms, resistance 48, 82 ohms, potential source 46, minus 15 volts, potential source 54, 2 volts, capacitance 58, 0.03 microfarad resistance 60, 33 ohms, potential source 68, minus 2 volts, resistance 80, 50 ohms, capacitance 82, 0.0024 microfarad, potential source 68, minus 2 volts, and resistances 24, 52, and 70, 330 ohms each. The load simulates an inductive load having an inductance value of 24 microhenry and a resistance value of 10 ohms. The transistor 62 may typically be one such as is designated 2N385. It is to be understood that the component values stated herein are applicable to a particular design application and it is not intended that the invention be limited thereby.

Utilizing the circuit values given in the preceding paragraph, a rectangular current pulse having an amplitude of 10 milliampere when applied through parallel combination 28 decays to 1 milliampere at the base 16 of transistor 10. A current of 40 milliamperes peak value decaying to 10 milliamperes is applied to base 36, of transistor 34 and a current of 100 milliamperes decaying to 20 milliamperes is applied to base 64 of transistor 62, the output stage. If the output stage is driven from cutoff to saturation by the application of the base drive, the output current pulse is 400 milliamperes at a 25% duty cycle. The rise and fall times are 0.5 microseconds and the storage is about 0.1 microsecond. The rise and fall times, pulse width and storage had an average deviation of less than 0.1 microsecond as random transistors were substituted in the circuit.

To understand the operation of the inductance compensating circuit comprising resistance 80 and capacitance 82; the following proposed explanation is submitted.

The total dissipation of a switching transistor consists of three parts: the base-to-emitter dissipation, the collector-to-emitter dissipation during the pedestal portion of the pulse and the collector-to-emitter dissipation during the transit time or "full on" to "full off" periods.

Considering the diagrams of FIGS. 2 and 3

$$\epsilon = {}_{\text{ENERGY}} = \int_{t=0}^{t=T} EI\,dt \qquad E(t) = E_{\max} - E_{\max}\left(\frac{\Delta t}{t}\right)$$

$$I(t) = 0 + I_{\max}\left(\frac{\Delta t}{T}\right)$$

$$\epsilon = \int_{t=0}^{t=T} I_{\max}E_{\max}\left(1 - \frac{\Delta t}{T}\right)\left(\frac{\Delta t}{T}\right)dt$$

$$\epsilon = I_{\max}E_{\max}\int_{t=0}^{t=T}\left(\frac{\Delta t}{T} - \frac{\Delta t^2}{T^2}\right)d(\Delta t)$$

$$= E_{\max}I_{\max}\left(\frac{\Delta t^2}{2T} - \frac{\Delta t^3}{3T^2}\right)_{\Delta t=0}^{\Delta t=T}$$

$$\epsilon = E_{\max}I_{\max}\left(\frac{T^2}{2T} - \frac{T^3}{3T^2}\right) = E_M I_M\left(\frac{T}{2} - \frac{T}{3}\right) = E_{\max}I_{\max}\frac{T}{6}$$

Since $$P_T = \frac{\epsilon}{T} \qquad P_T = \frac{P_{\max}}{6}$$

The duty cycle of $$P_T = \frac{2T}{\text{period}} \text{ or } 2Tf$$

thus $$P_{T\,\text{Ave}} = \frac{TXfxF_{\max}}{3} \tag{1}$$

In the last expression, T is transit time, $f$ is pulse repetition frequency and $P_{max}$ is the maximum power in the load.

Iin FIG. 4, which is a theoretical equivalent circuit of the output stage in FIG. 1, the ideal switch represents transistor 62, C represents capacitance 82, $R_1$ represents resistance 80 and R and L represent resistance 86 and inductance 84 respectively.

Considering the circuit of FIG. 4 in connection with the expression for $P_t$, since the pulse frequency and collector current will be held constant, the final expression simplifies using $K_I$ as a constant.

$$P_t = K_2 T R_L \text{ where } R_L = R_1 + R \text{ and } K_I = \frac{I^2 f}{3} \tag{2}$$

Capacitance C is inserted to provide partial compensation for the current rise time determined by $L/(R_1+R)$. The expression for the current as a function of time for the circuit of FIG. 4 may be developed as follows. Using the Laplace transform:

$$E=I(s)R+I(s)Ls+[I(s)-I_o(s)]R_1 \qquad (A)$$

$$\frac{I_o(s)}{Cs}=[I(s)-I_o(s)]R_1 \qquad (B)$$

Solving for $I(s)$:

$$I(s)=\frac{E}{L}\left[\frac{s+1/R_1C}{s[s^2+(R/L+1/R_1C)s+(R+R_1)/(R_1LC)]}\right] \qquad (C)$$

Using the inverse Laplace transform and solving the resulting equation for the critically damped case where $$C=\frac{L(R/R_1+2-2(1+R/R_1)^{1/2})}{R^2} \qquad (D)$$

there is obtained $$I(t)=\frac{E}{R+R_1}[1-\{1+(1/2R_1C-R/2L-R_1/L)t\}\exp -(1/2R_1C+R/2L)t] \qquad (E)$$

Expression E may be re-written in terms of only the original parameters R, $R_1$ and L if there is substituted for C, its value from expression D.

Thus $$I(t)=\frac{E}{R+R_1}\left[1-\left\{1+\frac{At}{(1+R/R_1)^{1/2}}\right\}\exp -\left[1+\frac{1}{(1+R/R_1)^{1/2}}\right]At\right] \qquad (F)$$

where $$A=\frac{R+R_1}{L}$$

Examination of Equation F shows that $I'(t)=0$ only at $t$ equal to infinity thus proving that there is no overshoot. Substitution of the values 0 and infinity for $$\frac{R}{R_1}$$

yields the two limiting cases.

When $$\frac{R}{R_1}=0$$

$$I(t)=\frac{E}{R+R_1}[1-(1+At)\exp -2At]$$

This is the dual analog of the voltage across a shunt peaked video amplifier interstage driven by a current source. In this case the 10% to 90% rise time $$=\frac{1.57}{A}$$

when $$\frac{R}{R_1}$$

approaches infinity $$I(t)=\frac{E}{R}\left[1-\exp -\frac{Rt}{L}\right]At\frac{R}{R_1}=1$$

the 10%–90% rise time is $$\frac{1.75}{A}$$

being continuously variable with neither maximum nor minimum from $$\frac{1.57}{A} \text{ to } \frac{1.75}{A} \text{ as } \frac{R}{R_1} \text{ varies from 0 to 1}$$

The final expression for the critically damped condition is:

$$I(t)=\frac{E}{R+R_1}\left[1-\left\{1+\left(\frac{1}{2R_1C}-\frac{R}{2L}-\frac{R_1}{L}\right)t\right\}\epsilon^{-\left(\frac{1}{2R_1C}+\frac{R}{2L}\right)t}\right] \qquad (3)$$

The expression for C for this critically damped condition is $$C=L\frac{\left(\frac{R}{R_1}+2-2\sqrt{1+\frac{R}{R_1}}\right)}{R^2} \qquad (4)$$

Equation 3 can be simplified for a given range of values including the circuit values given hereinabove to $$T_R=K_2\frac{L}{R_L} \qquad (5)$$

wherein $T_R$=rise time at the 10% to 90% points and $K_2$ is a constant which was determined experimentally to be 1.77. (In the absence of C, it would be 2.2.)

Combining Equations 2 and 5 and defining a new constant, the formula of Expression 2 reduces to $P_t=K_3L$ where $$K_3=0.590\ I^2f \qquad (6)$$

Equation 6 shows that to drive a load, which has a certain value of L, with a specified current and frequency, there is a corresponding value of transit time dissipation. And with this same load for each value of $R_1$, there is a corresponding value of C which gives critical damping (4). If, in addition to the load, the rise time is specified, $R_1$ and its corresponding value of C will be fixed, i.e. Expression 5. The expressions derived herein are based upon an ideal switch and are independent of the characteristics of the transistors.

When the ideal switch in FIG. 4 is replaced by a switching transistor as used in the output stage of the circuit of FIG. 1, the rise time of the current through the transistor with no inductance in the load is the limiting minimum rise time that can be obtained. If a chosen value of output current and pulse frequency is specified, the maximum dissaption rating of the transistor dictates the maximum inductance of a load that can be tolerated. Since the voltage drop across the transistor when it is conducting at saturation is a small fraction of a volt, the output current multiplied by the load resistance determines the supply voltage. Equation 5 shows, that with a fixed load, the rise time is inversely proportional to $R_1$. Therefore the maximum voltage rating of the transistor will dictate the minimum rise time that can be achieved in the cases where the rise time is not transistor limited.

Thus it is seen that with this invention, there is provided a transistor circuit wherein a current pulse of a chosen amplitude may be supplied through a given inductive load, said pulse having specified rise and fall times. Also, this invention further provides such a circuit wherein there is substantially reduced to a minimum, any charge storage delay effects.

The circuit of FIG. 1 has been depicted with three amplifier stages in cascade. It is to be understood that this particular circuit is one embodiment for providing a chosen output. Thus, there may be situations where only one or two stages may be required.

In considering the type of transistor to be used in the output stage of the circuit of FIG. 1, it is important to consider the capabilities of the transistor. As explained above, $$P_T=\frac{TxfxP_{max}}{3}$$

Actually, the total power dissipation of the output transistor is $$\frac{TxfxP_{max}}{3}+V_sI_{ave}$$

wherein T is transit time, $f$ is pulse repetition frequency, $P_{max}$ is maximum power in the load, $V_s$ is the voltage of the transistor when it is conducting at saturation, and $I_{ave}$ is the average current through the load. The voltage rating of the transistor should be in accordance with the expression $I(R_1+R)$ wherein I is peak current, and $R_1$ and R represent the values of resistances 80 and 86 respectively. The rise time of the output current pulse is in accordance with the expression $$\frac{L}{R_1+R}$$

wherein L is the value of inductance 84 and $R_1$ and R are the respective values of resistances 80 and 86.

While there have been described what are at present considered to be the preferred embodiments of the invention, it will be obvious to those skilled in the art that various changes and modifications may be made therein without departing from the invention and it is, therefore, aimed to cover all such changes and modifications as fall within the true spirit and scope of the invention.

What is claimed is:

1. A transistor circuit for providing a chosen current through an inductive load comprising an output transistor having said inductive load, a parallel combination of a resistance and a capacitance in series with said load, the value of said capacitance being in accordance with the expression $$C=L\frac{\left(\frac{R}{R_1}+2-2\sqrt{1+\frac{R}{R_1}}\right)}{R^2}$$

wherein C is the value of said capacitance, L is the inductance of said load, R is the value of the resistive component of said load, and $R_1$ is the value of said resistance, the power dissipation of said output transistor being in accordance with the expression $$\frac{TxfxP_{max}}{3}+V_sI_{ave}$$

wherein T is transit time, $f$ is pulse repetition frequency, $P_{max}$ is the maximum power in the load when said transistor is conducting at saturation, and $I_{ave}$ is the average current through the load, the voltage rating of said transistor being in accordance with the expression $I(R_1+R)$ wherein $R_1$ and R have their previous significance and I is peak current, said rise time being a function of the expression $$\frac{L}{R_1+R}$$

wherein L, $R_1$ and R have their previous significance, and means for applying biasing potentials to said output transistor whereby said transistor is maintained at collector current cutoff during quiescent states and wherein said transistor is rendered conductive at saturation upon the application of an appropriate input signal thereto.

2. A transistor circuit for providing a chosen current through an inductive load comprising an output transistor having said inductive load, a parallel combination of a resistance and a capacitance in series with said load, the value of said capacitance being in accordance with the expression $$C=L\frac{\left(\frac{R}{R_1}+2-2\sqrt{1+\frac{R}{R_1}}\right)}{R^2}$$

wherein C is the value of said capacitance, L is the inductance of said load, R is the value of the resistance of the resistive component of said load and $R_1$ is the value of said resistance, the power dissipation of said output transistor being in accordance with the expression $$\frac{TxfxP_{max}}{3}+V_sI_{ave}$$

wherein T is transit time, $f$ is pulse repetition frequency, $P_{max}$ is the maximum power in the load when said transistor is conducting at saturation, and $I_{ave}$ is the average current through the load, the voltage rating of said transistor being in accordance with the expression $I(R+R_1)$ wherein $R_1$ and R have their previous significance and I is peak current, said rise time being a function of the expression $$\frac{L}{R_1+R}$$

wherein L, $R_1$ and R have their previous significance, means for applying biasing potentials to said output transistor whereby said transistor is maintained at collector current cutoff during quiescent states and wherein said transistor is rendered conductive at saturation upon the application of an appropriate input signal thereto, wave shaping means in circuit with the input of said transistor and means for applying a rectangular current wave as an input to said transistor through said wave shaping means, said wave shaping means converting said rectangular wave to a wave having a relatively steep exponential decay, the value of the amplitude of said wave being so chosen that at its lowest amplitude, it is sufficient to cause said transistor to conduct at saturation.

3. A transistor circuit for providing a chosen current through an inductive load comprising an output transistor having said inductive load, a first parallel combination of a resistance and a capacitance in series with said load, the value of said capacitance being in accordance with the expression $$C=L\frac{\left(\frac{R}{R_1}+2-2\sqrt{1+\frac{R}{R_1}}\right)}{R^2}$$

wherein C is the value of said capacitance, L is the inductance of said load, R is the value of the resistance of the resistive component of said load and $R_1$ is the value of said resistance, the power dissipation of said output transistor being in accordance with the expression $$\frac{TxfxP_{max}}{3}+V_sI_{ave}$$

wherein T is transit time, $f$ is pulse repetition frequency, $P_{max}$ is the maximum power in the load when said transistor is conducting at saturation, and $I_{ave}$ is the average current through the load, the voltage rating of said transistor being in accordance with the expression $I(R+R_1)$ wherein $R_1$ and R have their previous significance, and I is peak current, said rise time being a function of the expression $$\frac{L}{R_1+R}$$

wherein L, $R_1$ and R have their previous significance, means for applying biasing potentials to said output transistor whereby said transistor is maintained at collector current cutoff during quiescent states and wherein said transistor is rendered conductive at saturation upon the application of an appropriate input signal thereto, a second parallel combination of a resistance and a capacitance in series with the input to said output transistor, the values of said resistance and capacitance being so chosen as to convert a rectangular wave to a wave having a relatively steep exponential decay, and means for applying a rectangular wave to the input of said output transistor through said second parallel combination, the amplitude of said wave being so chosen that at its most decayed point it is of a sufficient magnitude to maintain said output transistor at conduction at saturation.

4. A transistor circuit for providing a chosen current through an inductive load comprising an output transistor having said inductive load, a first parallel combination of a resistance and a capacitance in series with said load, the value of said capacitance being in accordance with the expression $$C=L\frac{\left(\frac{R}{R_1}+2-2\sqrt{1+\frac{R}{R_1}}\right)}{R^2}$$

wherein C is the value of said capacitance, L is the inductance of said load, R is the value of the resistance of the resistive component of said load and $R_1$ is the value of said resistance, the power dissipation of said output transistor being in accordance with the expression $$\frac{TxfxP_{max}}{3}+V_sI_{ave}$$

wherein T is transit time, F is pulse repetition frequency, $P_{max}$ is the maximum power in the load when said transistor is conducting at saturation, and $I_{ave}$ is the average current through the load, the voltage rating of said transistor being in accordance with the expression $I(R+R_1)$ wherein $R_1$ and R have their previous significance and I is peak current, said rise time being a function of the expression $$\frac{L}{R_1+R}$$

wherein L, $R_1$ and R have their previous significance, a second parallel combination of a resistance and a capacitance in series with the input to said output transistor, the values of said resistance and capacitance being so chosen as to convert a rectangular wave to a wave having a relatively sharp exponential decay, means for applying a rectangular wave to the input of said output transistor through said second parallel combination, the amplitude of said wave being so chosen that at its most decayed point, it is of a sufficient magnitude to maintain said output transistor at conduction at saturation, and means for applying biasing potentials to said output transistor to maintain it at collector current cutoff during quiescent periods and to cause its being rendered conductive at saturation upon the application to the input thereof of said wave, said biasing potentials being so chosen as to also substantially eliminate D.C. restoration effects caused by said capacitance of said second parallel combination.

5. A transistor circuit for providing a chosen current through an inductive load including a plurality of transistors connected in a series circuit arrangement in the grounded emitter configuration, each successive transistor in said series being of an opposite conductivity type than the immediately preceding transistor, said circuit including an output transistor having said inductive load, a first parallel combination of a resistance and a capacitance in series with said load, the value of said capacitance being in accordance with the expression $$C=L\frac{\left(\frac{R}{R_1}+2-2\sqrt{1+\frac{R}{R_1}}\right)}{R^2}$$

wherein C is the value of said capacitance, L is the inductance of said load, R is the value of the resistance of the resistive component of said load, $R_1$ is the value of said resistance, the power dissipation of said output transistor being in accordance with the expression $$\frac{TxfxP_{max}}{3}+V_sI_{ave}$$

wherein T is transit time, $f$ is pulse repetition frequency, $P_{max}$ is the maximum power in the load when said output transistor is conducting at saturation, and $I_{ave}$ is the average current through the load, the voltage rating of said transistor being in accordance with the expression $I(R+R_1)$ wherein $R_1$ and R have their previous significance and I is peak current, said rise time being a function of the expression $$\frac{L}{R_1+R}$$

wherein L, $R_1$ and R have their previous significance, second respective parallel combinations of a resistance and a capacitance in series with the inputs of the transistors in said circuit, the values of the respective resistances and capacitances of said second parallel combinations being so chosen as to convert a rectangular wave to a wave having a relatively sharp exponential decay, means for applying a rectangular wave to the respective inputs of said transistors through said second parallel combinations, the amplitude of said rectangular wave being so chosen that at its most decayed point, it is sufficient to maintain the transistor to which it is applied at saturation conduction, and means for applying biasing potentials to said transistors to maintain them at collector current cutoff during quiescent periods and to cause their being rendered conductive at saturation upon the application to the circuit of said wave, said biasing potentials being so chosen as to also substantially eliminate D.C. restoration effects caused by the respective capacitances of said second parallel combinations.

References Cited in the file of this patent

UNITED STATES PATENTS

| | | |
|---|---|---|
| 2,251,973 | Beale et al. | Aug. 12, 1941 |
| 2,544,322 | Barney | Feb. 13, 1951 |
| 2,585,078 | Barney | Feb. 12, 1952 |
| 2,666,817 | Raisbeck et al. | Jan. 19, 1954 |
| 2,750,456 | Waldhauer | June 12, 1956 |
| 2,759,052 | MacDonald et al. | Aug. 14, 1956 |
| 2,802,065 | Sziklai | Aug. 6, 1957 |
| 2,811,590 | Doremus et al. | Oct. 29, 1957 |
| 2,831,113 | Weller | Apr. 15, 1958 |
| 2,896,115 | Guggi | July 21, 1959 |
| 2,924,724 | Booker | Feb. 9, 1960 |
| 2,926,243 | Camp | Feb. 23, 1960 |

FOREIGN PATENTS

| | | |
|---|---|---|
| 715,826 | Great Britain | Sept. 22, 1954 |